US012701872B2

(12) United States Patent
Huang et al.

(10) Patent No.: US 12,701,872 B2
(45) Date of Patent: Aug. 4, 2026

(54) ARRAY SUBSTRATE HAVING AN ISOLATION PILLAR IN A HOLE BORDER AREA, PREPARATION METHOD THEREOF AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Weiyun Huang, Beijing (CN); Yao Huang, Beijing (CN); Chao Zeng, Beijing (CN); Yue Long, Beijing (CN); Tianyi Cheng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 525 days.

(21) Appl. No.: 17/433,041

(22) PCT Filed: Feb. 25, 2021

(86) PCT No.: PCT/CN2021/077944
§ 371 (c)(1),
(2) Date: Aug. 23, 2021

(87) PCT Pub. No.: WO2021/185045
PCT Pub. Date: Sep. 23, 2021

(65) Prior Publication Data
US 2022/0344421 A1 Oct. 27, 2022

(30) Foreign Application Priority Data
Mar. 20, 2020 (CN) .......................... 202010199096.4

(51) Int. Cl.
*H10K 59/124* (2023.01)
*H10K 59/122* (2023.01)
(Continued)

(52) U.S. Cl.
CPC ......... *H10K 59/124* (2023.02); *H10K 59/122* (2023.02); *H10K 59/1201* (2023.02); *H10K 59/8731* (2023.02)

(58) Field of Classification Search
CPC .... H10K 59/122; H10K 50/844; H10K 71/00; H10K 59/1201; H10K 71/621; H10K 59/124; H10K 59/12; H10K 50/84
(Continued)

(56) References Cited

U.S. PATENT DOCUMENTS 9,478,594 B2 10/2016 Odaka et al.
2005/0057717 A1* 3/2005 Rho .................... G02F 1/13394
349/158
(Continued)

FOREIGN PATENT DOCUMENTS

CN 109742117 A 5/2019
CN 109802052 A * 5/2019
(Continued)

OTHER PUBLICATIONS

International Search Report and Written Opinion for International Application No. PCT/CN2021/077944 mailed May 19, 2021.

*Primary Examiner* — Norman D Richards
*Assistant Examiner* — Laura M Dykes
(74) *Attorney, Agent, or Firm* — Perilla Knox & Hildebrandt; Kenneth A. Knox

(57) ABSTRACT

The present disclosure provides an array substrate, a preparation method thereof, and a display device. The array substrate has an opening area and a hole border area. A method of preparation of the array substrate includes: form-
(Continued)

ing a source-drain metal layer on a side of the base substrate, wherein the source-drain metal layer is formed with a first isolation pillar surrounding the opening area in the hole border area, and the first isolation pillar includes a first metal layer and a second metal layer located on a side of the first metal layer away from the base substrate; forming a planarization layer covering at least a lateral surface of each first metal layer; forming a pixel electrode layer; forming a protective layer covering the pixel electrode layer, the protective layer exposing the hole border area; removing a part of the planarization layer located in the hole border area; partially etching the first metal layer from the lateral surface to form a third metal layer; removing the protective layer; forming an organic light emitting layer and a common electrode layer in sequence. The preparation method of the array substrate can improve the yield of the array substrate.

10 Claims, 10 Drawing Sheets

(51) Int. Cl.
    *H10K 59/12*        (2023.01)
    *H10K 59/80*        (2023.01)

(58) Field of Classification Search
    USPC .......................................................... 257/40
    See application file for complete search history.

(56)                References Cited

U.S. PATENT DOCUMENTS

2015/0076476 A1     3/2015   Odaka et al.
2019/0355930 A1    11/2019   Lee et al.

FOREIGN PATENT DOCUMENTS

CN         109935621  A   *   6/2019
CN         110444690  A       11/2019
CN         110518147  A       11/2019
CN         110649177  A        1/2020
CN         110767827  A        2/2020
IN         110504380  A       11/2019
KR        20170041370  A       4/2017
WO        2020087852  A1       5/2020
WO        2020143464  A1       7/2020
WO        2021031898  A1       2/2021

* cited by examiner

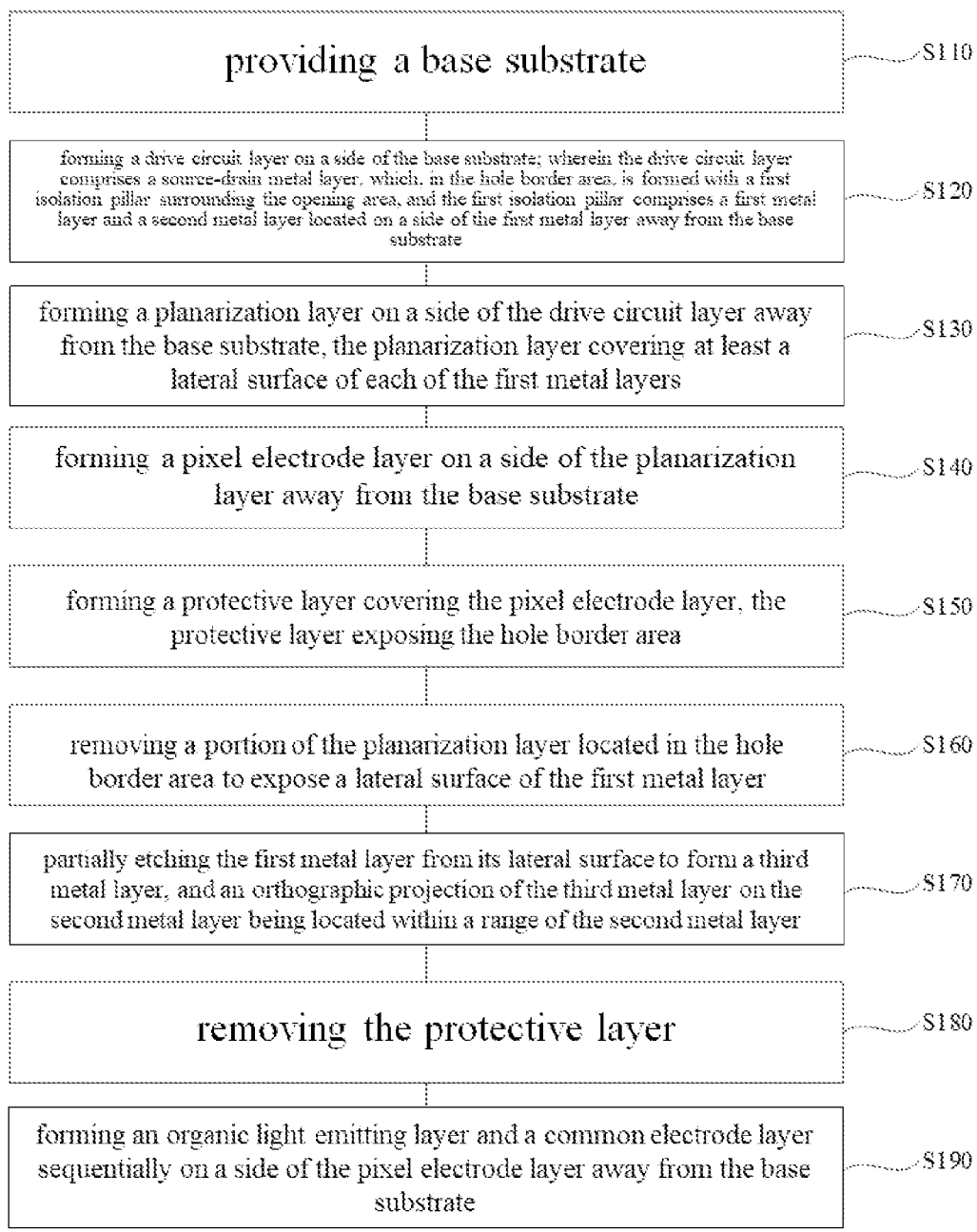

providing a base substrate ⌇—S110 forming a drive circuit layer on a side of the base substrate; wherein the drive circuit layer comprises a source-drain metal layer, which, in the hole border area, is formed with a first isolation pillar surrounding the opening area, and the first isolation pillar comprises a first metal layer and a second metal layer located on a side of the first metal layer away from the base substrate ⌇—S120 forming a planarization layer on a side of the drive circuit layer away from the base substrate, the planarization layer covering at least a lateral surface of each of the first metal layers ⌇—S130 forming a pixel electrode layer on a side of the planarization layer away from the base substrate ⌇—S140 forming a protective layer covering the pixel electrode layer, the protective layer exposing the hole border area ⌇—S150 removing a portion of the planarization layer located in the hole border area to expose a lateral surface of the first metal layer ⌇—S160 partially etching the first metal layer from its lateral surface to form a third metal layer, and an orthographic projection of the third metal layer on the second metal layer being located within a range of the second metal layer ⌇—S170 removing the protective layer ⌇—S180 forming an organic light emitting layer and a common electrode layer sequentially on a side of the pixel electrode layer away from the base substrate ⌇—S190

Fig. 5

ARRAY SUBSTRATE HAVING AN ISOLATION PILLAR IN A HOLE BORDER AREA, PREPARATION METHOD THEREOF AND DISPLAY DEVICE

CROSS-REFERENCE TO RELATED APPLICATIONS

The present disclosure is a national phase application under 35 U.S.C. § 371 of International Application No. PCT/CN2021/077944 filed Feb. 25, 2021, which claims the benefit of and priority to Chinese Patent Application No. 202010199096.4 entitled "ARRAY SUBSTRATE, PREPARATION METHOD THEREOF AND DISPLAY DEVICE," and filed on Mar. 20, 2020, where the contents of both of which are incorporated by reference in their entireties herein.

TECHNICAL FIELD

The present disclosure relates to the field of display technology and, in particular to an array substrate, a preparation method thereof, and a display device.

BACKGROUND

With the development of display technology, the application of perforated screens on mobile phones and other devices has become more and more widespread. For OLED (organic light emitting diode) display panels, the perforated area is prone to problems, such as water and oxygen intrusion. In order to reduce the risk of water and oxygen intrusion, isolation pillars can be formed in the hole border area by the source-drain metal layer, and the isolation pillars are used to isolate the organic light emitting layer and the common electrode layer, thereby isolating the water and oxygen intrusion channel. However, when the pixel electrodes and the isolation pillars are formed through an etching process, the isolation pillars will react with the etching solution to generate metal particles, which may easily cause dark spot defects.

The above-mentioned information disclosed in the background section is only used to strengthen the understanding of the background of the present disclosure, and therefore it may include information that does not constitute the prior art known to those of ordinary skill in the art.

SUMMARY

An object of the present disclosure is to provide an array substrate, a preparation method thereof, and a display device to improve the yield of the array substrate.

In order to achieve the above-mentioned object of the invention, the present disclosure adopts the following technical solutions:

According to a first aspect of the present disclosure, there is provided a preparation method of an array substrate, wherein the array substrate has an opening area and a hole border area; and the preparation method of the array substrate comprises:

providing a base substrate;

forming a drive circuit layer on a side of the base substrate; wherein the drive circuit layer comprises a source-drain metal layer, which is formed with a first isolation pillar surrounding the opening area in the hole border area, and the first isolation pillar comprises a first metal layer and a second metal layer located on a side of the first metal layer away from the base substrate;

forming a planarization layer on a side of the drive circuit layer away from the base substrate, the planarization layer covering at least a lateral surface of each of the first metal layers;

forming a pixel electrode layer on a side of the planarization layer away from the base substrate;

forming a protective layer for covering the pixel electrode layer, the protective layer exposing the hole border area;

removing a portion of the planarization layer located in the hole border area to expose a lateral surface of the first metal layer;

partially etching the first metal layer from its lateral surface to form a third metal layer, and an orthographic projection of the third metal layer on the second metal layer being located within a range of the second metal layer;

removing the protective layer;

forming an organic light emitting layer and a common electrode layer sequentially on a side of the pixel electrode layer away from the base substrate.

In an exemplary embodiment of the present disclosure, forming the drive circuit layer on the side of the base substrate comprises:

in the hole border area, forming the first metal layer and the second metal layer on the side of the first metal layer away from the base substrate; wherein a material of the first metal layer is aluminum; a material of the second metal layer is titanium.

In an exemplary embodiment of the present disclosure, forming the drive circuit layer on the side of the base substrate comprises:

in the hole border area, forming the first isolation pillar surrounding the opening area, and the first isolation pillar further comprising a fourth metal layer located on a side of the first metal layer close to the base substrate, wherein a material of the fourth metal layer is the same as the material of the second metal layer.

In an exemplary embodiment of the present disclosure, forming the planarization layer on the side of the drive circuit layer away from the base substrate comprises:

forming a planarization material layer covering the source-drain metal layer;

performing a patterning operation on the planarization material layer to form the planarization layer, and the planarization layer covering at least the lateral surface of the first metal layer.

In an exemplary embodiment of the present disclosure, performing the patterning operation on the planarization material layer to form the planarization layer comprises:

performing the patterning operation on the planarization material layer through a halftone exposure process, so that a thickness of the planarization layer in the hole border area is smaller than a thickness of the planarization material layer.

In an exemplary embodiment of the present disclosure, forming the protective layer covering the pixel electrode layer comprises:

forming the protective layer for covering the pixel electrode layer, and a thickness of the protective layer being greater than a thickness of the planarization layer in the hole border area.

In an exemplary embodiment of the present disclosure, the preparation method of the array substrate further comprises:

forming a pixel definition layer on the side of the pixel electrode layer away from the base substrate before forming the organic light emitting layer.

In an exemplary embodiment of the present disclosure, forming the pixel definition layer on the side of the pixel electrode layer away from the base substrate comprises:

forming a photoresist material layer for covering the pixel electrode layer and the hole border area;

exposing and developing the photoresist material layer to form the pixel definition layer; wherein a part of the photoresist material layer remains on a side of the second metal layer close to the base substrate to form a support portion for supporting the second metal layer.

According to a second aspect of the present disclosure, there is provided an array substrate, comprising an opening and a hole border area surrounding the opening; the array substrate comprising:

a base substrate formed with the opening;

a drive circuit layer provided on a side of the base substrate, wherein the drive circuit layer comprises a source-drain metal layer which is formed with a second isolation pillar surrounding the opening in the hole border area, and the second isolation pillar comprises a third metal layer and a second metal layer located on a side of the third metal layer away from the base substrate; the second isolation pillar is formed with a partition groove located on a side of the second metal layer close to the base substrate, so that an orthographic projection of the third metal layer on the second metal layer is within a range of the second metal layer;

a support portion provided on the side of the second metal layer close to the base substrate and filling a part of the partition groove;

a pixel electrode layer provided on a side of the drive circuit layer away from the base substrate;

an organic light emitting layer provided on a side of the pixel electrode layer away from the base substrate, and divided into a plurality of disconnected parts in the hole border area by the second isolation pillar;

a common electrode layer provided on a side of the organic light emitting layer away from the base substrate, and divided into a plurality of disconnected parts in the hole border area by the second isolation pillar.

In an exemplary embodiment of the present disclosure, the second isolation pillar further comprises a fourth metal layer, and the fourth metal layer is provided on a surface of the third metal layer close to the base substrate; an orthographic projection of the third metal layer on the fourth metal layer is located within a range of the fourth metal layer.

In an exemplary embodiment of the present disclosure, the support portion is at least located at a corner of a junction of the third metal layer and the second metal layer.

In an exemplary embodiment of the present disclosure, the support portion further covers a lateral surface of the third metal layer.

In an exemplary embodiment of the present disclosure, the support portion is also located at a corner of a junction of the third metal layer and the fourth metal layer.

In an exemplary embodiment of the present disclosure, a material of the support portion is a photoresist.

According to a third aspect of the present disclosure, there is provided a display device comprising the array substrate mentioned above.

In the array substrate, the preparation method thereof and the display device provided by the present disclosure, the planarization layer can be used to protect the first metal layer after the first isolation pillar is formed. Thus, the etching solution will not contact with the first metal layer when the pixel electrode layer is formed, avoiding the generation of metal particles when the pixel electrode layer is formed, thereby avoiding the occurrence of dark spot defects caused by the metal particles. After the pixel electrode layer is formed, the pixel electrode layer can be protected by a protective layer and the hole border area is exposed, and then the planarization layer in the hole border area is removed to expose the lateral surface of the first metal layer, and the first metal layer is etched from the lateral surface to form the third metal layer, thus forming the second isolation pillar including the second metal layer and the third metal layer, and the second isolation pillar is formed with a partition groove. After the protective layer is removed, the organic light emitting layer and the common electrode layer can be vapor-deposited. Due to the existence of the partition groove, the organic light emitting layer and the common electrode layer are not continuous at the second isolation pillar. In this way, the second isolation pillar separates the organic light emitting layer and the common electrode layer into a plurality of discontinuous parts, blocks the water and oxygen intrusion channel, and ensures the encapsulation effect of the array substrate in the hole border area. In summary, the preparation method of the array substrate provided by the present disclosure can not only avoid the dark spot defects caused by the metal particles, but also block the water and oxygen intrusion channel in the hole border area, which can improve the yield of the array substrate.

BRIEF DESCRIPTION OF THE DRAWINGS

The above-mentioned and other features and advantages of the present disclosure will become more apparent by describing the exemplary embodiments thereof in detail with reference to the accompanying drawings.

FIG. 5 is a schematic flowchart of a preparation method of the array substrate in an embodiment of the present disclosure.

DETAILED DESCRIPTION

Figure 1:
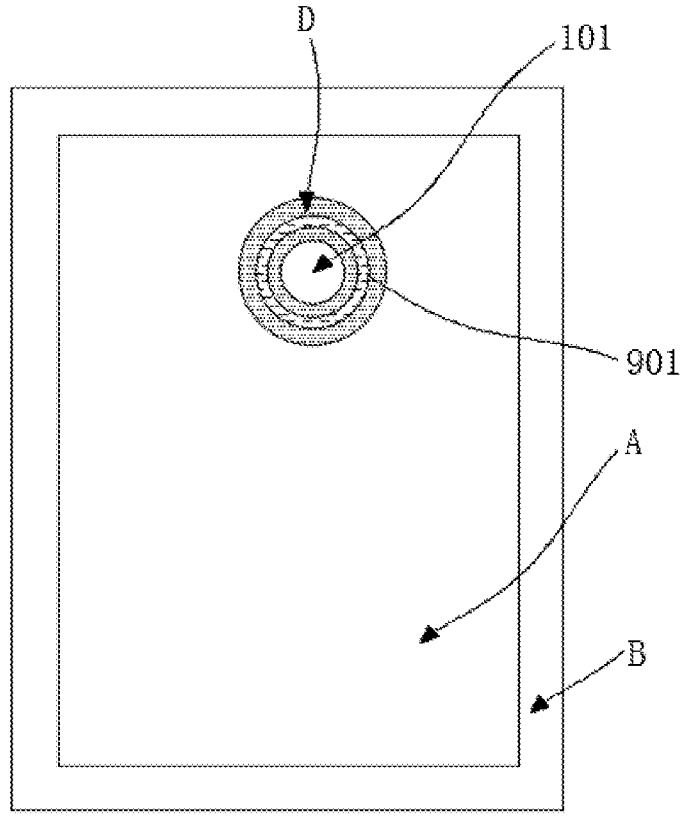
FIG. 1 is a schematic top view of a perforated screen in the related art.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The described features, structures or characteristics may be combined in one or more embodiments in any suitable manner. In the following description, many specific details are provided to give a sufficient understanding of the embodiments of the present disclosure.

In the drawings, the thicknesses of areas and layers may be exaggerated for clarity. The same reference numerals in the figures represent the same or similar structures, and thus their detailed descriptions will be omitted.

The described features, structures or characteristics may be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, materials, etc. can be used. In other cases, well-known structures, materials, or operations are not shown or described in detail to avoid obscuring the main technical ideas of the present disclosure.

When a structure is "on" another structure, it may mean that a certain structure is integrally formed on other structures, or that a certain structure is "directly" installed on other structures, or that a certain structure is "indirectly" installed on other structures through another structure.

The terms "a", "an", and "the" are used to indicate the presence of one or more elements/components/etc.; the terms "include" and "have" are used to mean open-ended inclusion and means that there may be additional elements/components/etc. in addition to the listed elements/components/etc. The labels "first", "second", and so forth are used only as example labels, and are not a numerical restriction to the objects.

The reference signs of the main components in the figures are explained as follows: 100, base substrate; 101, opening; 200, source-drain metal layer; 201, first metal layer; 202, second metal layer; 203, third metal layer; 204, fourth metal layer; 210, first isolation pillar; 220, second isolation pillar; 221, partition groove; 300, planarization layer; 400, pixel electrode layer; 410, protective layer; 500, organic light emitting layer; 600, common electrode layer; 700, encapsulation layer; 800, pixel definition layer; 801, support portion; 802, support pillar; 810, photoresist material layer; 901, isolation pillar; 902, titanium layer; 903, aluminum layer; 904, titanium layer; A, display area; B, peripheral area; C, opening area; D, hole border area; 010, drive circuit layer; 011, active layer; 012, gate insulating layer; 013, gate layer; 014, interlayer dielectric layer; 015, barrier layer; 016, buffer layer; 020, pixel layer; 030, thin film encapsulation layer; 031, first inorganic encapsulation layer; 032, organic encapsulation layer; 033, second inorganic encapsulation layer; 041, antireflection layer; 042, touch control function layer; and 401, pixel electrode.

As shown in FIG. 1, a perforated screen generally includes a display area A and a peripheral area B surrounding the display area A. An opening 101 is disposed in the display area A, and the opening 101 can be used to place a photosensitive component. The photosensitive component can receive light transmitted through the opening 101. In this way, the display device based on the perforated screen can not only realize the sensing of external light, but also can prevent the photosensitive element from occupying the screen space and affecting the screen-to-body ratio of the display device, thereby increasing the screen-to-body ratio of the display device. The photosensitive component may be a camera, an infrared sensor, an iris recognition module, a facial recognition module, a face identification (face ID) module, or another module capable of sensing external light. The perforated screen also needs to be provided with a hole border area D surrounding the opening 101 in order to achieve effective encapsulation.

Figure 2:
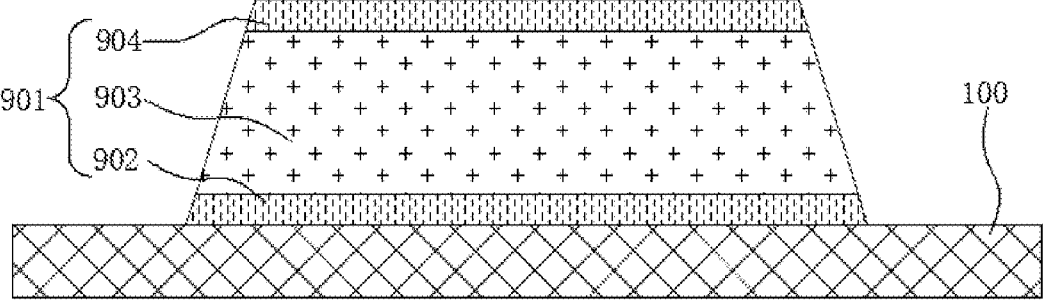
FIG. 2 is a structural schematic diagram of an isolation pillar in the related art.
Figure 3:
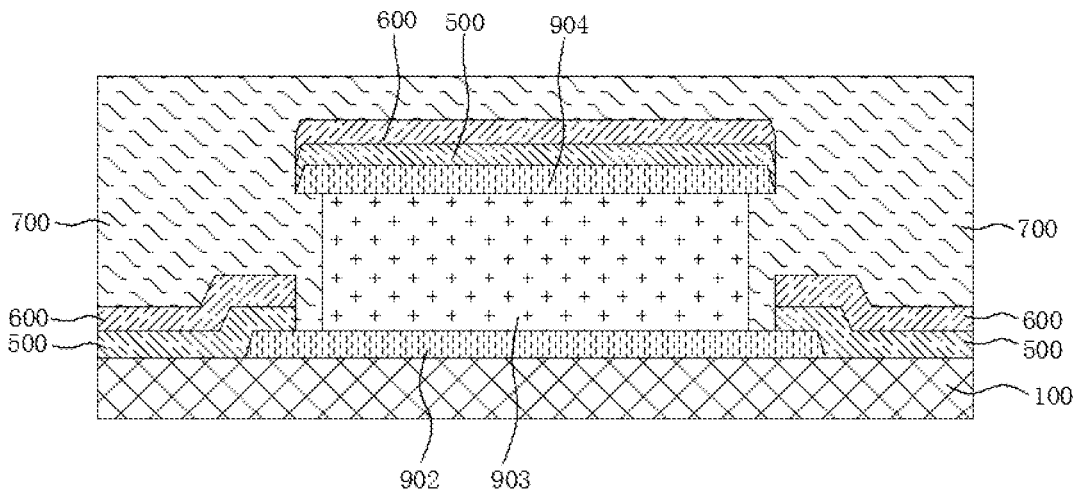
FIG. 3 is a structural schematic diagram in which an organic light emitting layer and a common electrode layer are separated by the isolation pillar in the related art.

In the related art, as shown in FIG. 1, FIG. 2, and FIG. 3, in order to improve the encapsulation effect of the OLED display panel in the hole border area D, a source-drain metal layer may be used to form an isolation pillar 901 surrounding the opening 101, so as to divide the portions of an organic light emitting layer 500 and a common electrode layer 600 located in the hole border area D into a plurality of discontinuous portions by the isolation pillar 901, so as to achieve the purpose of blocking the water and oxygen intrusion channel. During preparation, the source-drain metal layer may be patterned for the first time to form the isolation pillar 901 surrounding the opening 101. As shown in FIG. 2, the isolation pillar 901 may include a titanium layer 902, an aluminum layer 903, and a titanium layer 904 stacked in sequence. Then, as shown in FIG. 3, when patterning the pixel electrode layer, the etching solution can partially etch the aluminum layer 903, so that the isolation pillars 901 are in the shape of "I". However, the pixel electrode layer can generate silver nitrate during etching.

The silver nitrate may perform a displacement reaction with aluminum to generate silver particles. The generated silver particles may remain in the display area A of the display panel and cause a short circuit between the pixel electrode and the common electrode layer, which will cause defective dark spots on the display panel.

Figure 4:
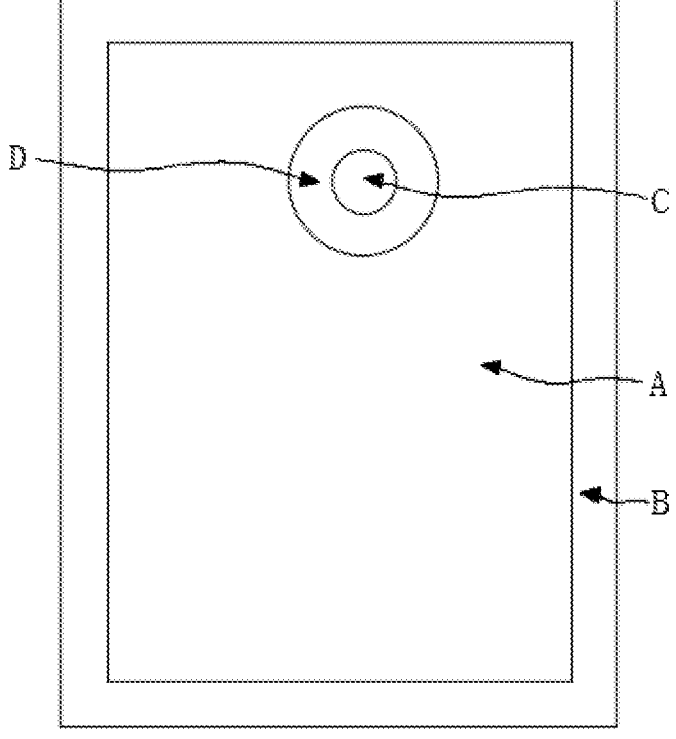
FIG. 4 is a structural schematic top view of an array substrate in an embodiment of the present disclosure.
Figure 6:
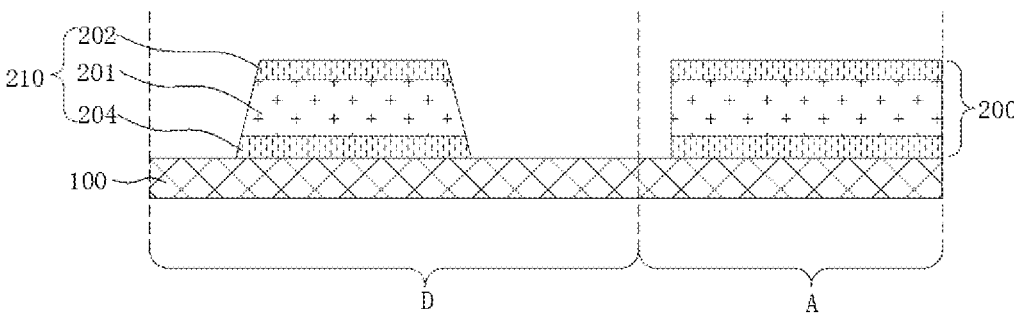
FIG. 6 is a structural schematic diagram of forming a source-drain metal layer in an embodiment of the present disclosure.
Figure 7:
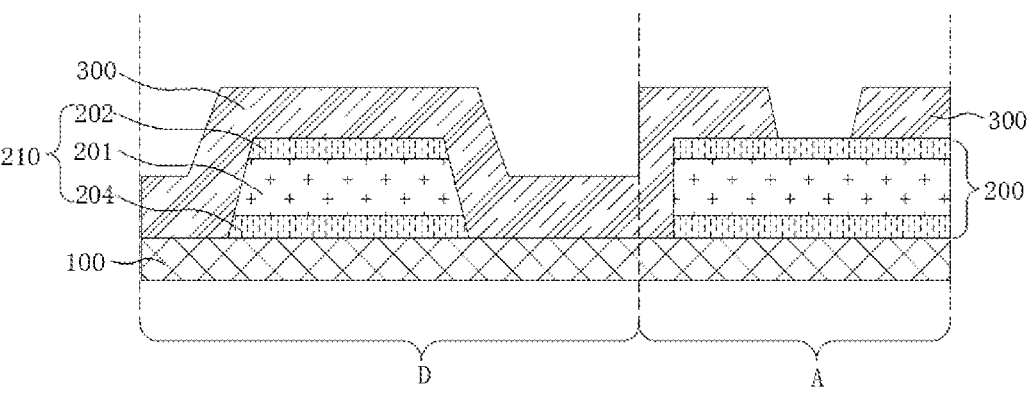
FIG. 7 is a structural schematic diagram of forming a planarization layer in an embodiment of the present disclosure.
Figure 10:
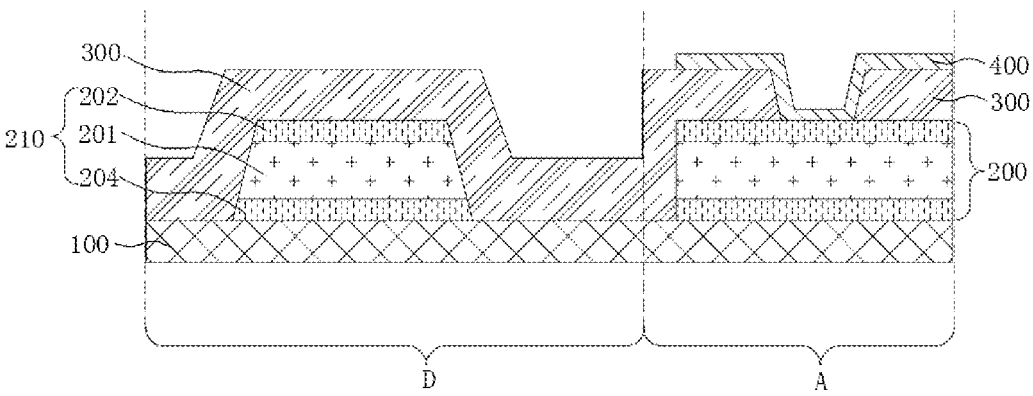
FIG. 10 is a structural schematic diagram of forming a pixel electrode layer in an embodiment of the present disclosure.
Figure 11:
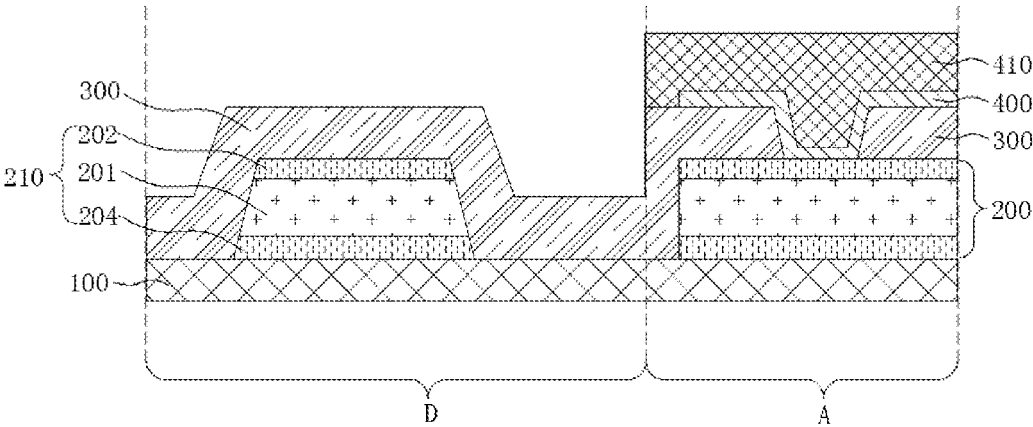
FIG. 11 is a structural schematic diagram of forming a protective layer in an embodiment of the present disclosure.
Figure 12:
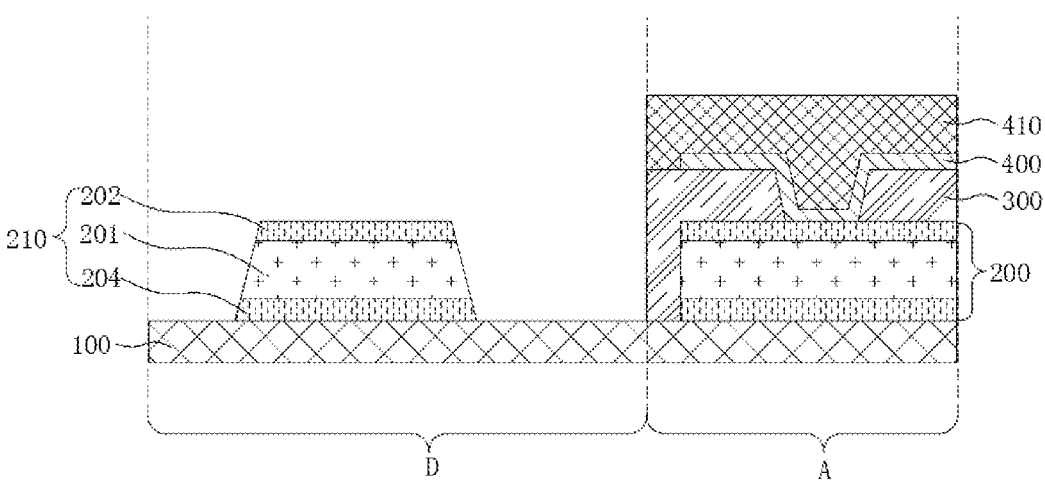
FIG. 12 is a structural schematic diagram of removing the planarization layer located in the hole border area in an embodiment of the present disclosure.
Figure 13:
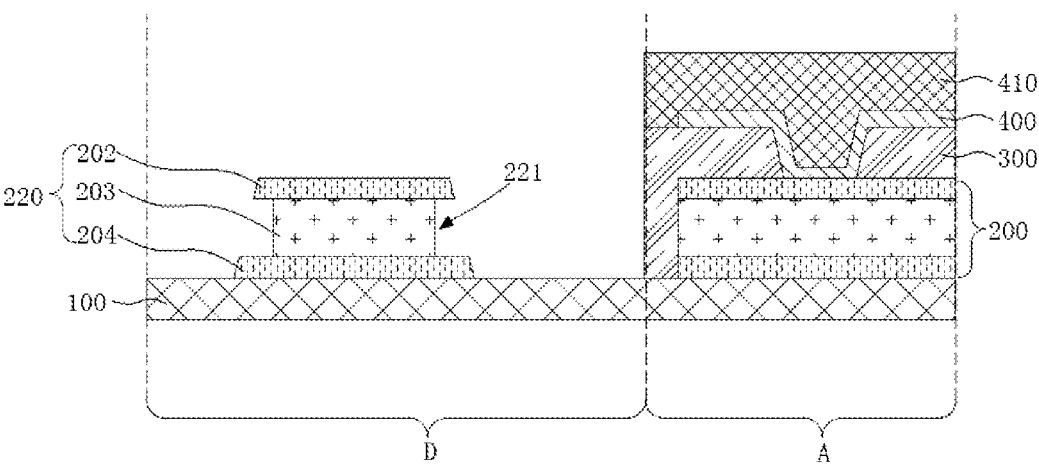
FIG. 13 is a structural schematic diagram of forming a second isolation pillar in an embodiment of the present disclosure.
Figure 14:
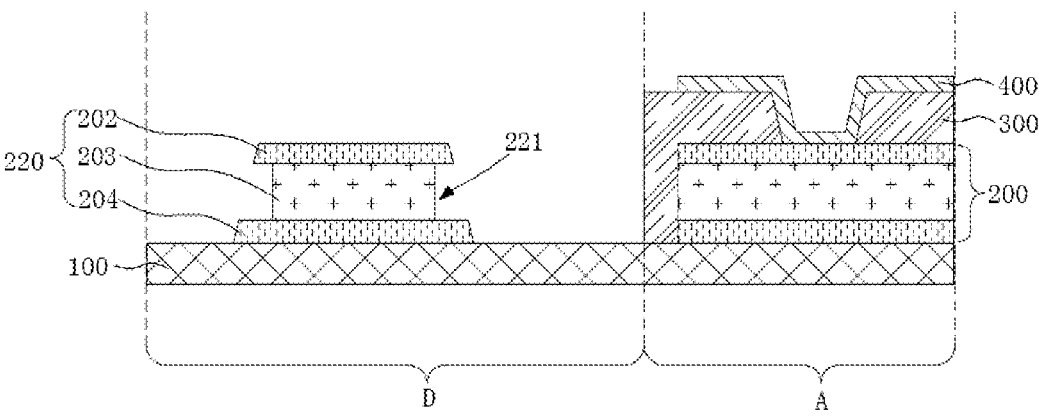
FIG. 14 is a structural schematic diagram of removing a protective layer in an embodiment of the present disclosure.
Figure 20:
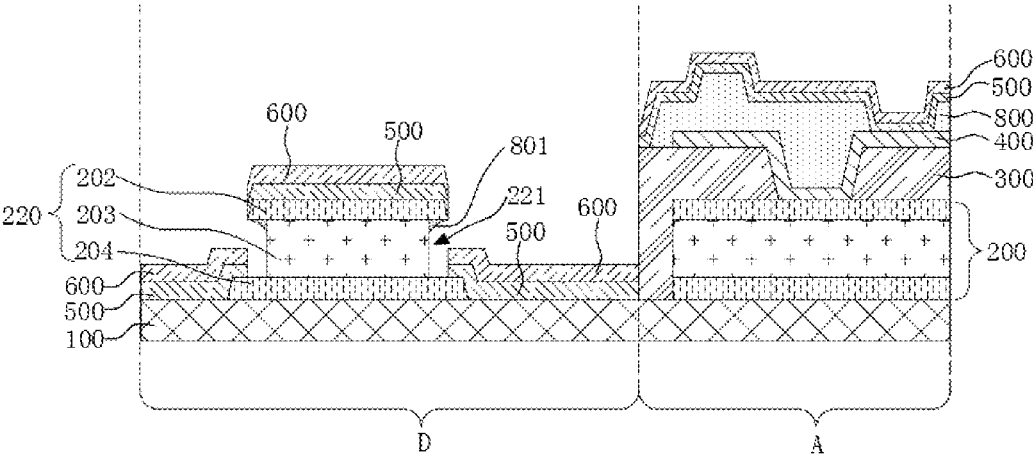
FIG. 20 is a structural schematic diagram of forming an organic light emitting layer and a common electrode layer in an embodiment of the present disclosure.

In order to solve the above problems, the present disclosure provides a preparation method of an array substrate. As shown in FIG. 4, the array substrate has an opening area C and a hole border area D surrounding the opening area C. As shown in FIG. 5, the preparation method of the array substrate includes:

step S110, as shown in FIG. 6, providing a base substrate 100;

step S120, as shown in FIG. 6, forming a drive circuit layer on a side of the base substrate 100; wherein the drive circuit layer comprises a source-drain metal layer 200, which, in the hole border area D, is formed with a first isolation pillar 210 surrounding the opening area C, and the first isolation pillar 210 comprises a first metal layer 201 and a second metal layer 202 located on a side of the first metal layer 201 away from the base substrate 100;

step S130, as shown in FIG. 7, forming a planarization layer 300 on a side of the drive circuit layer away from the base substrate 100, the planarization layer 300 covering at least a lateral surface of each of the first metal layers 201;

step S140, as shown in FIG. 10, forming a pixel electrode layer 400 on a side of the planarization layer 300 away from the base substrate 100;

step S150, as shown in FIG. 11, forming a protective layer 410 covering the pixel electrode layer 400, the protective layer 410 exposing the hole border area D;

step S160, as shown in FIG. 12, removing a portion of the planarization layer 300 located in the hole border area D to expose a lateral surface of the first metal layer 201;

In step S170, as shown in FIG. 13, partially etching the first metal layer 201 from its lateral surface to form a third metal layer 203, and an orthographic projection of the third metal layer 203 on the second metal layer 202 being located within a range of the second metal layer 202;

Step S180, as shown in FIG. 14, removing the protective layer 410;

Step S190, as shown in FIG. 20, forming an organic light emitting layer 500 and a common electrode layer 600 sequentially on a side of the pixel electrode layer 400 away from the base substrate 100.

In the preparation method of the array substrate provided in the present disclosure, the planarization layer 300 may be used to protect the first metal layer 201 after the first isolation pillar 210 is formed. Thus, when the pixel electrode layer 400 is formed, the etching solution will not contact the first metal layer 201, preventing metal particles from being generated when the pixel electrode layer 400 is formed, and thereby avoiding the occurrence of dark spots by the metal particles. After the pixel electrode layer 400 is formed, the pixel electrode layer 400 can be protected by the protective layer 410 and the hole border area D is exposed, and then the planarization layer 300 in the hole border area D is removed to expose the lateral surface of the first metal layer 201. A metal layer 201 is etched from the lateral surface to form a third metal layer 203, thus forming a second isolation pillar 220 including the second metal layer 202 and the third metal layer 203. Referring to FIG. 13, in the second isolation pillar 220, the cross-section of the second metal layer 202 and the third metal layer 203 as a whole is T-shaped, so that a partition groove 221 is formed between a surface on a side of the second metal layer 202 close to the base substrate 100 and the lateral surface of the third metal layer 203; in other words, the second isolation pillar 220 is formed with the partition groove 221. After the protective layer 410 is removed, the organic light emitting layer 500 and the common electrode layer 600 may be vapor-deposited. Due to the existence of the partition groove 221, the organic light emitting layer 500 and the common electrode layer 600 are not continuous at the second isolation pillar 220. In this way, the second isolation pillar 220 separates the organic light emitting layer 500 and the common electrode layer 600 into a plurality of discontinuous parts, blocks the water and oxygen intrusion channel, and ensures the encapsulation effect of the array substrate in the hole border area D. In summary, the preparation method of the array substrate provided by the present disclosure can not only avoid the dark spots caused by the metal particles, but also block the water and oxygen intrusion channel in the hole border area D, which can improve the yield of the array substrate.

It can be understood that, in FIGS. 6 to 21, only a part of the film layers in the drive circuit layer are shown, for example, only the source-drain metal layer 200 in the drive circuit layer is shown.

In the following, with reference to the accompanying drawings, each step, principle, and effect of the preparation method of the array substrate provided by the present disclosure will be further explained and described.

In step S110, the base substrate 100 of the array substrate may be provided. The base substrate 100 may be an inorganic material base substrate 100 or an organic material base substrate 100. For example, in an embodiment of the present disclosure, the material of the base substrate 100 may be glass material such as soda-lime glass, quartz glass, sapphire glass, etc., or may be metallic material such as stainless steel, aluminum, nickel, etc. In another embodiment of the present disclosure, the material of the base substrate 100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), Polyethylene naphthalate (PEN), or a combination thereof. In another embodiment of the present disclosure, the base substrate 100 may also be a flexible base substrate 100. For example, the material of the base substrate 100 may be polyimide (PI). The base substrate 100 may also be a composite of multiple layers of materials. For example, in an embodiment of the present disclosure, the base substrate 100 may include a bottom film layer, a pressure-sensitive adhesive layer, a first polyimide layer and a second polyimide layer sequentially stacked.

Figure 23:
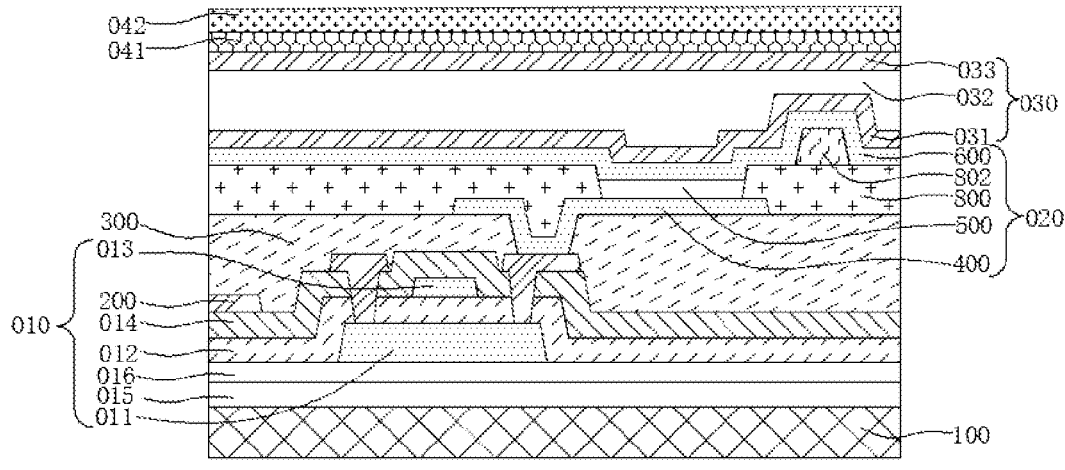
FIG. 23 is a structural schematic diagram of an array substrate in an embodiment of the present disclosure.

In step S120, referring to FIG. 23, a drive circuit layer 010 may be formed on a side of the base substrate 100. The drive circuit layer 010 may be formed with a plurality of pixel driving circuits, and each pixel driving circuit is used to drive a corresponding light emitting device. Any pixel driving circuit may include a thin film transistor and a storage capacitor. In terms of the film structure, the thin film transistor can be a top gate thin film transistor, a double gate thin film transistor or a bottom gate thin film transistor, which is not limited in the present disclosure. In terms of thin film transistor material, the thin film transistor may be a low-temperature polysilicon thin film transistor, an amorphous silicon thin film transistor, an organic semiconductor thin film transistor or an oxide thin film transistor, which is not limited in the present disclosure. In terms of the conduction condition of the thin film transistor, the thin film transistor may be an N-type thin film transistor or a P-type thin film transistor, which is not limited in the present disclosure.

It can be understood that, among the thin film transistors in the pixel driving circuit, any two thin film transistors may have the same type or different types. Exemplarily, in one embodiment, in one pixel driving circuit, part of the thin film transistors may be N-type transistors and part of the thin film transistors may be P-type transistors. Illustratively, in another embodiment of the present disclosure, in a pixel driving circuit, the materials of the active layers of part of the thin film transistors may be low-temperature polysilicon semiconductor material, and the materials of the active layers of part of the thin film transistors may be metal oxide semiconductor material.

Optionally, referring to FIG. 23, in the drive circuit layer 010, each thin film transistor and storage capacitor may be formed by an active layer 011, a gate insulating layer 012, a gate layer 013, an interlayer dielectric layer 014, a source-drain metal layer 200, etc. The positional relationship of all film layers can be determined according to the film layer structure of the thin film transistor. For example, in an embodiment of the present disclosure, the drive circuit layer 010 may include the active layer 011, the gate insulating layer 012, the gate layer 013, the interlayer dielectric layer 014 and the source-drain metal layer 200 stacked in sequence, and the formed thin film transistor is a top gate thin film transistor. For another example, in another embodiment of the present disclosure, the drive circuit layer 010 may include the gate layer 013, the gate insulating layer 012, the active layer 011, the interlayer dielectric layer 014, and the source-drain metal layer 200 stacked in sequence, and the formed thin film transistor is a bottom gate thin film transistor. The drive circuit layer 010 may also adopt a double gate structure, that is, the gate layer 013 may include a first gate layer and a second gate layer, and the gate insulating layer 012 may include a first gate insulating layer for isolating the active layer 011 and the first gate layer, and a second gate insulating layer for isolating the first gate layer and the second gate layer. For example, in an embodiment of the present disclosure, the drive circuit layer 010 may include the active layer 011, the first gate insulating layer, the first gate layer, the second gate insulating layer, the second gate layer, the interlayer dielectric layer 014 and the source-drain metal layer 200 stacked in sequence on a side of the base substrate 100.

Optionally, referring to FIG. 23, the drive circuit layer 010 may further include a buffer material layer disposed between the base substrate 100 and the active layer 011, and the active layer 011, the gate layer 013, etc. are all located on a side of the buffer material layer away from the base substrate 100. A material of the buffer material layer may be inorganic insulating material such as silicon oxide and silicon nitride. The buffer material layer may be a layer of inorganic material, or may be a multilayer laminated inorganic material layer. Exemplarily, in an embodiment of the present disclosure, referring to FIG. 23, the buffer material layer may include a barrier layer 015 on a side thereof close to the base substrate 100 and a buffer layer 016 on a side of the barrier layer 015 away from the base substrate 100. The barrier layer 015 is used to block the ions and other components in the base substrate 100 from penetrating into the drive circuit layer 010, so that the drive circuit layer 010 maintains stable performance. The buffer layer 016 can improve the bonding force between the drive circuit layer 010 and the base substrate 100, and provide a stable environment for the drive circuit layer 010.

In step S120, as shown in FIG. 6, in the hole border area D, the source-drain metal layer 200 is formed with a first isolation pillar 210 surrounding the opening area C. The first isolation pillar 210 includes a first metal layer 201 and a second metal layer 202 located on a side of the metal layer 201 away from the base substrate 100.

The source-drain metal layer 200 may be formed by the following method: a first metal material layer and a second metal material layer are sequentially formed on a side of the interlayer dielectric layer away from the base substrate 100 to form a source-drain metal material layer. The source-drain metal material layer covers at least the hole border area D; the source-drain metal material layer is patterned to form the source-drain metal layer 200 including the first isolation pillar 210. In this way, as shown in FIG. 6, no partition groove 221 is formed in the formed first isolation pillar 210.

Optionally, the first isolation pillar 210 may further include a fourth metal layer 204 located on a side of the first metal layer 201 close to the base substrate 100. In an embodiment of the present disclosure, a material of the fourth metal layer 204 is the same as a material of the second metal layer 202. In this way, the first isolation pillar 210 may be a sandwich structure formed by the fourth metal layer 204, the first metal layer 201 and the second metal layer 202 stacked in sequence.

Optionally, the material of the first metal layer 201 may be aluminum, and the material of the second metal layer 202 may be titanium. In this way, in step S170, as shown in FIG. 12 and FIG. 13, in the case where a lateral surface of the first metal layer 201 and a side surface of the second metal layer 202 are both exposed, an appropriate etching solution can be selected for etching the lateral surface the first metal layer 201 without etching the second metal layer 202, thereby forming the third metal layer 203 (the third metal layer 203 is a residual of the first metal layer 201) and the second isolation pillar 220 formed by the second metal layer 202, such that the second isolation pillar 220 is formed with a partition groove 221. It can be understood, when the first isolation pillar 210 further includes the fourth metal layer 204, the second isolation pillar 220 also includes the fourth metal layer 204 correspondingly.

Optionally, the number of the first isolation pillars 210 is in plural. Of course, in other embodiments of the present disclosure, the number of the first isolation pillar 210 may also be one.

Optionally, the first isolation pillar 210 has a ring shape surrounding the opening area C. For example, it may be a circular ring, a regular hexagonal ring, a regular octagonal ring, or other closed rings surrounding the opening area C. Of course, in other embodiments of the present disclosure, the first isolation pillar 210 may also have a non-closed shape surrounding the opening area C, and for example, may have a ring shape with one or more notches.

In step S120, a plurality of first isolation pillars 210 surrounding the opening areas C are formed in the hole border areas D, and each of the first isolation pillars 210 has a ring shape and is arranged in a concentric circle.

In step S130, the planarization layer 300 may be formed by the following method: a planarization material layer is formed on a side of the source-drain metal layer 200 away from the base substrate 100, and then a patterning operation is performed on the planarization material layer to form a planarization layer 300. As shown in FIG. 7, the formed planarization layer 300 covers at least the lateral surface of the first metal layer 201, so as to prevent the first metal layer

201 from contacting the etching solution in step S140, thereby avoiding the generation of metal particles in step S140.

Figure 8:
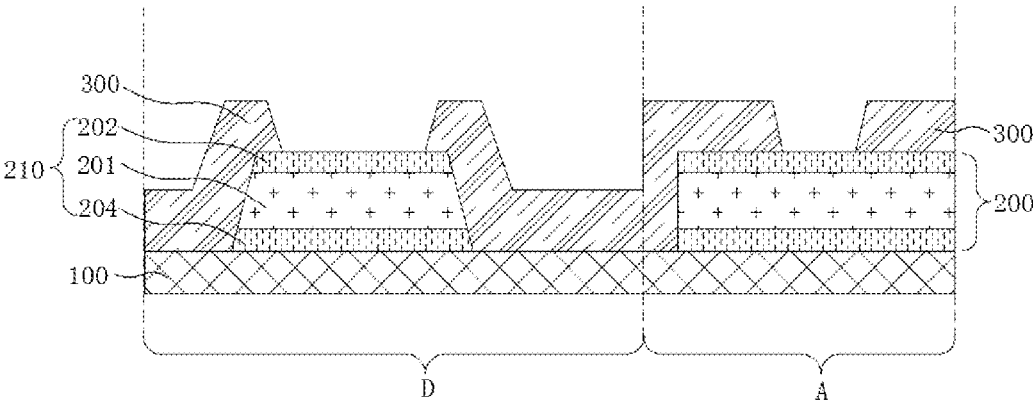
FIG. 8 is a structural schematic diagram of forming a planarization layer in an embodiment of the present disclosure.
Figure 9:
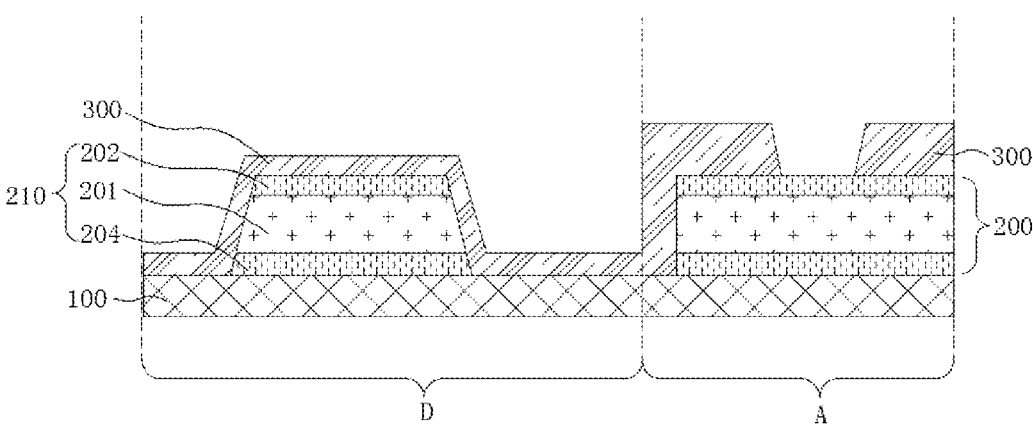
FIG. 9 is a structural schematic diagram of forming a planarization layer in an embodiment of the present disclosure.

The planarization layer 300 may cover only the lateral surface of the first metal layer 201, or cover the lateral surface of the first metal layer 201 and part of the second metal layer 202 (as shown in FIG. 8), or may completely cover the first metal layer 201 and the second metal layer 202 (as shown in FIGS. 7 and 9). The pattern of the planarization layer 300 in the hole border area D can be adjusted by adjusting the pattern of the mask.

In the present disclosure, the lateral surface of a film layer or structure refers to such a surface of a film layer or structure other than surfaces of the film layer or structure close to and away from the base substrate 100. In other words, the film layer or structure may include a surface close to the base substrate 100, a surface away from the base substrate 100, and a lateral surface connecting the above mentioned two surfaces. Correspondingly, the lateral surface of the first metal layer 201 refers to a surface other than surfaces of the first metal layer 201 close to and away from the base substrate 100.

In an embodiment of the present disclosure, as shown in FIG. 9, a halftone mask can be used to pattern the planarization material layer, so that the planarization layer 300 is thinned in the hole border area D, thereby reducing the etch time and etch depth in step S160. For example, in step S140, after the planarization material layer is formed, the planarization material layer may be patterned by a halftone exposure process, so that the thickness of the planarization layer 300 in the hole border area D is smaller than that of the planarization material layer.

The material of the planarization layer 300 may be an inorganic insulating material or an organic insulating material. In an embodiment of the present disclosure, the material of the planarization layer 300 may be photoresist, for example, PI (polyimide).

Optionally, the drive circuit layer 010 may further include a passivation layer, and the passivation layer may be provided between the source-drain metal layer 200 and the planarization layer 300 to protect the source-drain metal layer 200. In an embodiment of the present disclosure, a passivation material layer and a planarization material layer may be sequentially formed on a side of the source-drain metal layer 200 away from the base substrate 100, and then the passivation material layer and the planarization material layer may be patterned to form the planarization layer and the passivation layer. It can be understood, when the drive circuit layer is formed with a passivation layer, in step S160, the passivation layer covering the lateral surface of the first metal layer needs to be removed so as to expose the lateral surface of the first metal layer.

Referring to FIG. 23, after the planarization layer 300 is formed, a pixel layer 020 may be formed. The pixel layer 020 may be formed on a side of the planarization layer 300 and the driving the circuit layer 010 away from the base substrate 100, and provided with light emitting devices distributed in an array. Each light emitting device can be electrically connected to each pixel driving circuit, so as to emit light under the control of the pixel driving circuit. In some embodiments, the light emitting device may be an organic electroluminescent diode (OLED).

Optionally, referring to FIG. 23, the pixel layer 020 may include a pixel electrode layer 400, an organic light emitting layer 500 and a common electrode layer 600 stacked on a side of the planarization layer 300 away from the base substrate 100 in sequence. The pixel electrode layer 400 has a plurality of pixel electrodes in the display area A of the array substrate. The organic light emitting layer 500 may include an organic electroluminescent material layer, and may include one or more of a hole injection layer, a hole transport layer, an electron blocking layer, a hole blocking layer, an electron transport layer, and an electron injection layer. Each film layer of the organic light emitting layer 500 can be prepared by an evaporation process, and a fine metal mask or an open mask can be used to define the pattern of each film during the evaporation. It can be understood, when preparing certain layers of the organic light emitting layer 500, for example, when preparing a hole injection layer or an electron injection layer, an open mask may also be used. The common electrode layer 600 may cover the organic light emitting layer 500 in the display area A. In this way, the pixel electrode, the common electrode layer 600, and the organic light emitting layer 500 located between the pixel electrode and the common electrode layer 600 form an organic electroluminescent diode, and any organic electroluminescent diode can be used as a sub-pixel of the display panel.

In step S140, a pixel electrode material layer may be formed on the side of the planarization layer 300 away from the base substrate 100, and then the pixel electrode material layer may be patterned to form a pixel electrode layer 400 (as shown in FIG. 10). The pixel electrode layer 400 may include pixel electrodes distributed in an array.

Optionally, a material of the pixel electrode layer 400 may include metallic silver. In an embodiment of the present disclosure, the material of the pixel electrode layer 400 may further include metal oxide, for example, including ITO (Indium Tin Oxide). In an embodiment of the present disclosure, the pixel electrode layer 400 includes a silver reflective layer located on a side of the planarization layer 300 away from the base substrate 100 and an ITO layer located on a side of the silver reflective layer away from the base substrate 100. In another embodiment of the present disclosure, the pixel electrode layer 400 may adopt a metal material containing silver, which for example may be a magnesium-silver alloy or may be metallic silver.

When the pixel electrode material layer is patterned, the etching solution can react with the pixel electrode material layer to generate a metal salt. If the metal salt contacts the first metal layer 201, a substitution reaction may occur, thereby generating metal particles. For example, when an etching solution containing nitric acid is used to etch the pixel electrode material layer, the nitric acid reacts with silver to generate silver nitrate; if the silver nitrate contacts the aluminum of the first metal layer 201, the silver nitrate will undergo a substitution reaction with the aluminum, and then generate silver particles. According to the preparation method of the array substrate of the present disclosure, in step S140, the lateral surface of the first metal layer 201 is covered by the planarization layer 300, so there is no contact between the etching solution in step S140 and the lateral surface of the first metal layer 201. The generation of metal particles can be avoided, and the dark spots can be reduced.

In step S150, the protective layer 410 may be formed by the following method: coating a photoresist layer on a side of the pixel electrode layer 400 away from the base substrate 100, and then exposing and developing the photoresist layer to form the protective layer 410 covering the pixel electrode layer 400 and exposing the hole border area D (as shown in FIG. 11).

Optionally, the thickness of the protective layer 410 may be greater than the thickness of the planarization layer 300 in the hole border area D. In this way, in step S160, when a portion of the planarization layer 300 in the hole border area D is etched, even if the protective layer 410 is etched, it can be ensured that the protective layer 410 will not be completely etched, thereby achieving a purpose of effective protection of the pixel electrode layer 400.

In step S160, as shown in FIG. 12, the portion of the planarization layer 300 in the hole border area D may be removed by etching to expose the lateral surface of the first metal layer 201.

In step S170, as shown in FIG. 13, the first metal layer 201 may be partially etched from the lateral surface to form a third metal layer 203. An orthographic projection of the third metal layer 203 on the second metal layer 202 is located within the range of the second metal layer 202. In this way, the third metal layer 203 and the second metal layer 202 form a second isolation pillar 220, and the second isolation pillar 220 is formed with a partition groove 221 located on a side of the second metal layer 202 close to the base substrate 100, and an orthographic projection of the partition groove 221 on the second metal layer 202 is located inside the second metal layer 202, and the opening faces the lateral surface.

Optionally, as shown in FIG. 13, when the first isolation pillar 210 further includes the fourth metal layer 204, the second isolation pillar 220 formed in step S170 has a "I" shape.

In step S170, an etching solution that can etch the first metal layer 201 but not the second metal layer 202 and the fourth metal layer 204 may be selected. For example, the material of the first metal layer 201 is aluminum, and the material of the second metal layer 202 is titanium. The selected etching solution may be an acid etching solution, for example, an etching solution containing nitric acid.

In step S190, the organic light emitting layer 500 and the common electrode layer 600 may be sequentially formed by an evaporation method. As shown in FIG. 20, when the material of the organic light emitting layer 500 is deposited in the hole border area D, the material of the organic light emitting layer 500 is not continuous at the partition groove 221 because the second isolation pillar 220 is provided with the partition groove 221, so that the organic light emitting layer 500 is separated into a plurality of discontinuous parts by the second isolation pillar 220. Similarly, when the material of the common electrode layer 600 is deposited in the hole border area D, since the second isolation pillar 220 is provided with the partition groove 221, the material of the common electrode layer 600 is discontinuous at the partition groove 221, so that the common electrode layer 600 is separated into a plurality of discontinuous parts by the second spacer 220.

Optionally, the common electrode layer 600 is a transparent electrode, which may be a metal oxide (for example, ITO, etc.), or a transparent metal material, for example, a magnesium-silver alloy or the like.

The preparation method of the array substrate provided by the present disclosure may further include forming a pixel definition layer. In an embodiment of the present disclosure, the pixel definition layer may be formed before step S150, that is, after the pixel electrode layer 400 is formed, the pixel definition layer is formed on a side of the pixel electrode layer 400 away from the base substrate 100; and then, the protective layer 410 is formed on a side of the pixel definition layer away from the base substrate 100.

Figure 16:
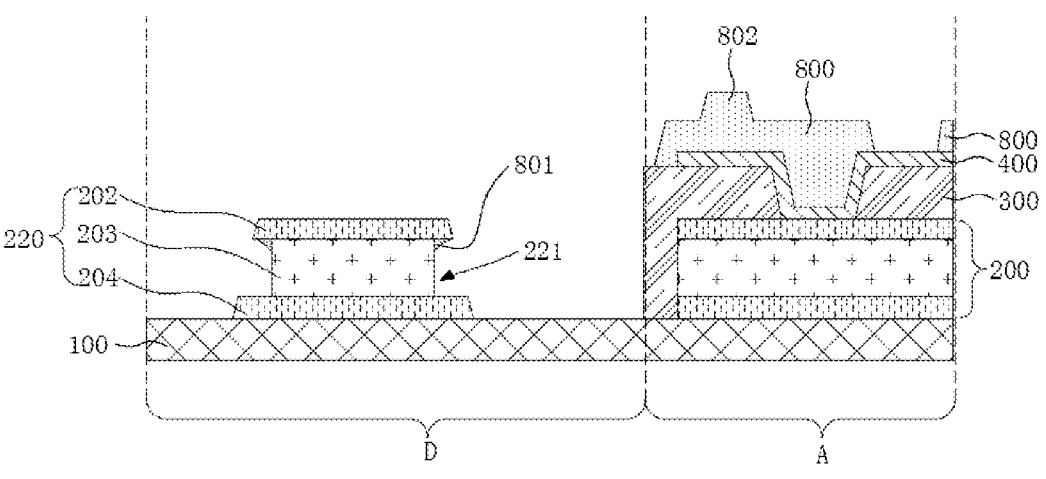
FIG. 16 is a structural schematic diagram of forming a pixel definition layer and a support pillar in an embodiment of the present disclosure.

In another embodiment of the present disclosure, as shown in FIG. 16, a pixel definition layer 800 may be formed after step S180, that is, after the second spacer 220 is formed, the protective layer 410 is removed to expose the pixel electrode layer 400, and then the pixel definition layer 800 is formed on a side of the pixel electrode layer 400 away from the base substrate 100, and then, the organic light emitting layer 500 and the common electrode layer 600 are sequentially formed. Optionally, the material of the pixel definition layer 800 may be photoresist, for example, a PI (polyimide) material containing a photosensitizer may be used.

Figure 15:
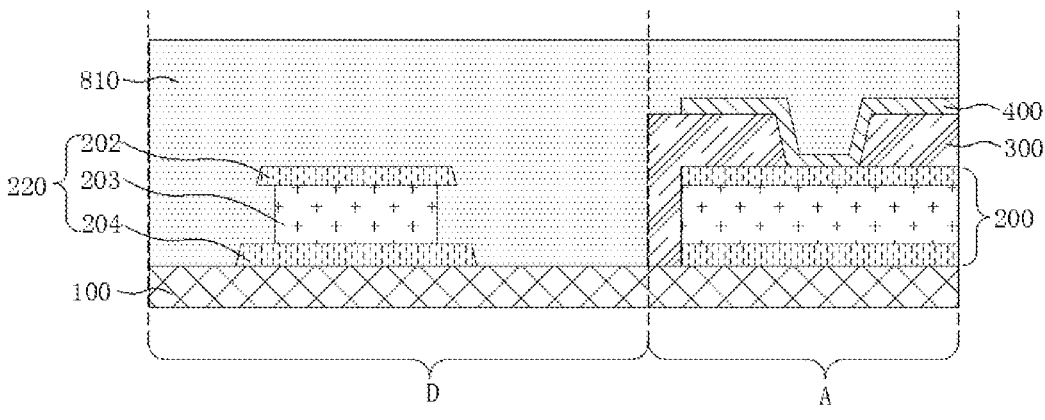
FIG. 15 is a structural schematic diagram of forming a photoresist material layer in an embodiment of the present disclosure.

For example, the pixel definition layer 800 can be formed by the following method: as shown in FIG. 15, a photoresist material layer 810 covering the pixel electrode layer 400 and the hole border area D is formed, so that the photoresist material layer 810 can be filled in the partition groove 221 of the second isolation pillar 220. As shown in FIG. 16, the photoresist material layer 810 is exposed and developed to form a pixel definition layer 800. During the exposure process, because the second metal layer 202 shields the photoresist material in the partition groove 221, and part of the photoresist material in the partition groove 221 will not be irradiated by light, during development, part of the photoresist material layer 810 remains on a side of the second metal layer 202 close to the base substrate 100, that is, part of the photoresist material remains in the partition groove 221, and only part of the space in the partition groove 221 contains photoresist. The remaining photoresist material forms a support portion 801 capable of supporting the second metal layer 202. In this way, the support portion 801 can effectively support the second metal layer 202, reduce the degree of suspension of the second metal layer 202 due to the partition groove 221, and prevent the suspended part of the second metal layer 202 from falling, especially to prevent the suspended part of the second metal layer 202 from falling during the subsequent encapsulation process, which improves the yield of the array substrate and reduces the risk of failure of the array substrate encapsulation.

Figure 17:
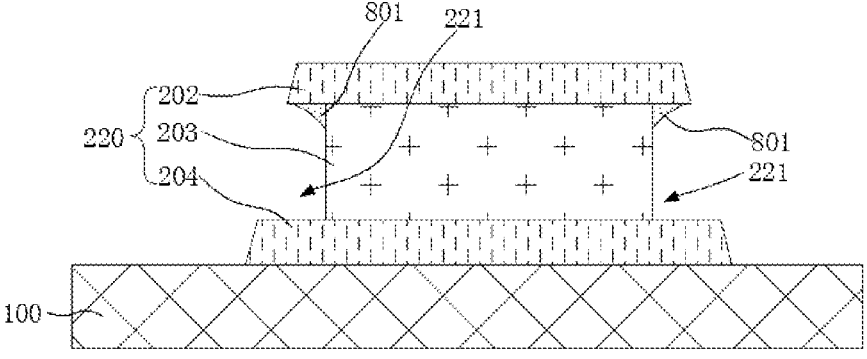
FIG. 17 is a positional schematic diagram of a support portion in an embodiment of the present disclosure.
Figure 18:
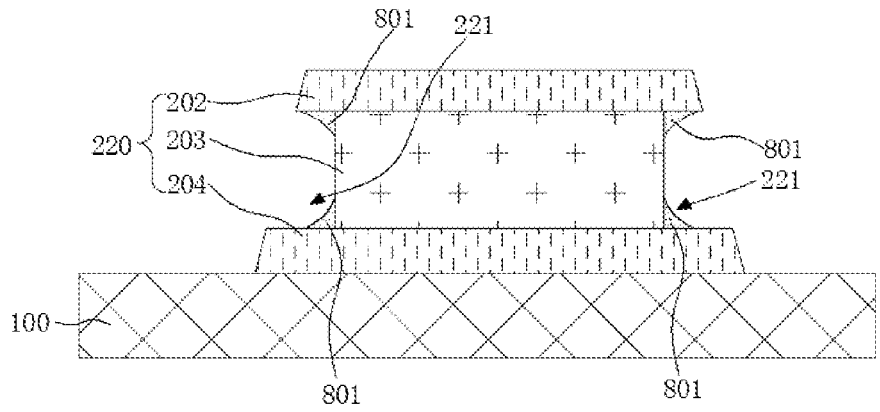
FIG. 18 is a positional schematic diagram of a support portion in an embodiment of the present disclosure.
Figure 19:
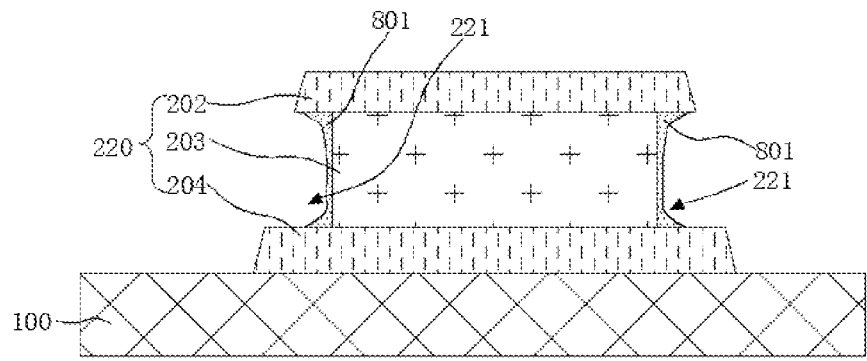
FIG. 19 is a positional schematic diagram of the support portion in an embodiment of the present disclosure.

Depending on the amount of exposure, the photoresist material, the partition groove 221, etc., the support portion 801 may represent different shapes and positions. In an embodiment of the present disclosure, as shown in FIG. 17, the support portion 801 may be formed at a corner where the third metal layer 203 and the second metal layer 202 are joined. In another embodiment of the present disclosure, as shown in FIG. 18, the support portion 801 may be formed not only at a corner between the second metal layer 202 and the third metal layer 203 but also at a corner between the third metal layer 203 and the fourth metal layer 204 at the same time. In another embodiment of the present disclosure, as shown in FIG. 19, the support portion 801 may cover the lateral surface of the third metal layer 203, and is also formed at the corner between the second metal layer 202 and the third metal layer 203 and a corner between the second metal layer 202 and the fourth metal layer 204.

Optionally, as shown in FIG. 16, a halftone mask may be used to expose the photoresist material layer 810, so that the photoresist material layer 810 simultaneously forms the pixel definition layer 800 and a support pillar 802 located on a side of the pixel definition layer 800 away from the base substrate 100. The support pillar 802 is located on a surface of the pixel definition layer 800 away from the base substrate 100 to support the fine metal mask (FMM) during the evaporation process. The organic light emitting layer 500 covers at least the pixel electrode exposed by the pixel definition layer 800.

In some embodiments, the pixel layer 020 may further include a light extraction layer located on a side of the common electrode layer 600 away from the base substrate 100 to enhance the light extraction efficiency of the organic light emitting diode. Correspondingly, in an embodiment, after the common electrode layer 600 is formed, the light extraction layer may be formed on a surface of the common electrode layer 600 away from the base substrate.

Figure 21:
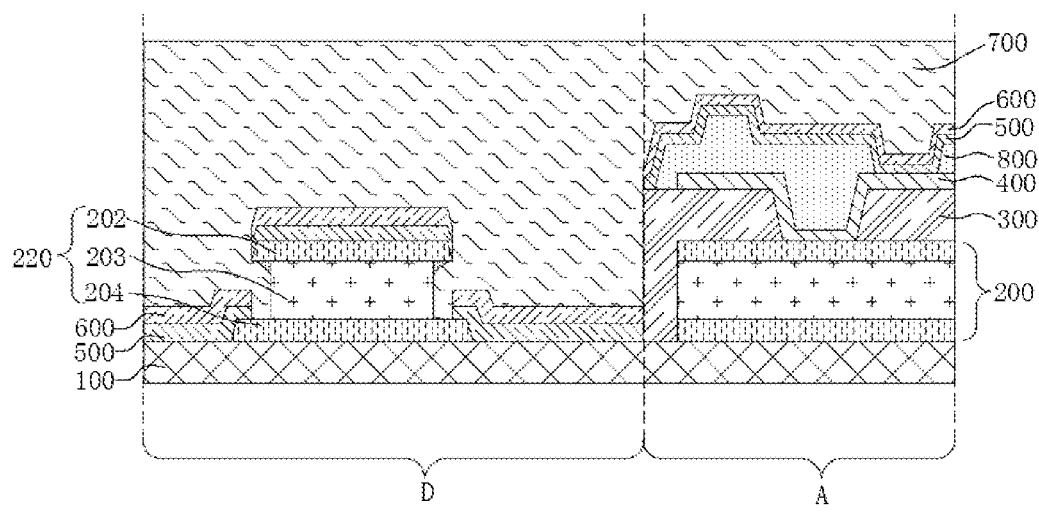
FIG. 21 is a structural schematic diagram of forming an encapsulation layer in an embodiment of the present disclosure.
Figure 22:
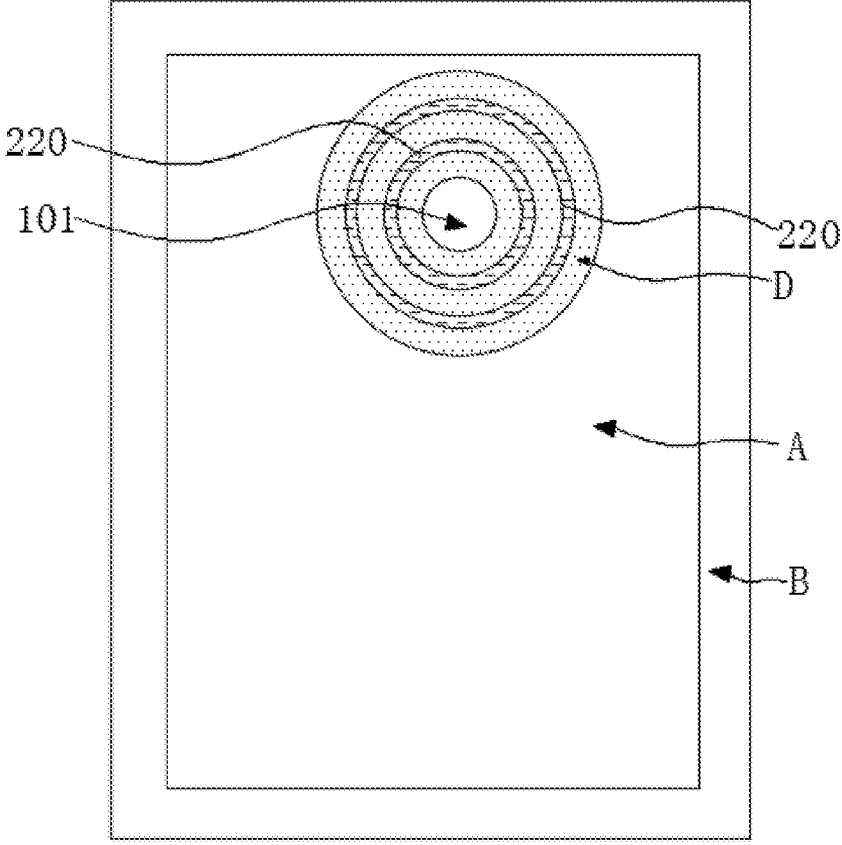
FIG. 22 is a structural schematic top view of an array substrate in an embodiment of the present disclosure.

Optionally, the preparation method of the array substrate provided by the present disclosure may further include, as shown in FIG. 21, forming an encapsulation layer 700 on the side of the common electrode layer 600 away from the base substrate 100. In an embodiment of the present disclosure, the encapsulation layer 700 may be a thin film encapsulation layer 030. Exemplarily, referring to FIG. 23, the array substrate may further include the thin film encapsulation layer 030. The thin film encapsulation layer 030 is provided on a surface of the pixel layer 020 away from the base substrate 100, and may include inorganic encapsulation layer(s) and organic encapsulation layer(s) alternately stacked. The inorganic encapsulation layer can effectively block external moisture and oxygen, and prevent water and oxygen from intruding the organic light emitting layer 500 and then causing material degradation. Optionally, an outer edge of the inorganic encapsulation layer may be located in a peripheral area. The organic encapsulation layer is located between two adjacent inorganic encapsulation layers to achieve planarization and reduce the stress between the inorganic encapsulation layers. An edge of the organic encapsulation layer is located between the display area A and an edge of the inorganic encapsulation layer. Exemplarily, referring to FIG. 23, the thin film encapsulation layer 030 includes a first inorganic encapsulation layer 031, an organic encapsulation layer 032, and a second inorganic encapsulation layer 033 that are sequentially stacked on a side of the pixel layer 020 away from the base substrate 100.

Optionally, referring to FIG. 33, the array substrate may further include an antireflection layer 041, and the antireflection layer 041 may be disposed on a side of the thin film encapsulation layer 030 away from the pixel layer 020 to reduce the reflection of the array substrate to ambient light, thereby reducing the influence of ambient light on the display effect. Correspondingly, the preparation method of the array substrate provided in the present disclosure may further include forming the antireflection layer 041 on a side of the thin film encapsulation layer 030 away from the base substrate after the thin film encapsulation layer 030 is formed. In an embodiment of the present disclosure, the antireflection layer 041 may include a color film layer and a black matrix layer stacked, which can reduce the interference of ambient light while avoiding reducing the light transmittance of the array substrate. In another embodiment of the present disclosure, the antireflection layer 041 may be a polarizer, for example, a patterned coated circular polarizer.

Optionally, referring to FIG. 23, the array substrate may further include a touch control function layer 042. The touch control function layer 042 is provided on the side of the thin film encapsulation layer 030 away from the base substrate 100 for realizing the touch-control operation of the array substrate. Correspondingly, the preparation method of the array substrate provided in the present disclosure may further include, after forming the thin film encapsulation layer 030, forming the touch control function layer 042 on the side of the thin film encapsulation layer 030 away from the base substrate. In an embodiment of the present disclosure, the touch control function layer 042 may be provided between the thin film encapsulation layer 030 and the antireflection layer 041.

The preparation method of the array substrate provided by the present disclosure may further include, as shown in FIG.

22, forming an opening 101 in the opening area C. In this way, the array substrate has the opening 101, and the hole border area D is provided around the opening 101; in the hole border area D, the second isolation pillar 220 is formed; the second isolation pillar 220 includes the third metal layer 203 and the second metal layer 202 stacked in sequence, and the second metal layer 202 is partially suspended to form the partition groove 221; the partition groove 221 may also be formed with the support portion 801 therein for supporting the second metal layer 202, and the support portion 801 is only filled part of the space of the partition groove 221. The array substrate further includes the pixel electrode layer 400, the organic light emitting layer 500, and the common electrode layer 600 which are sequentially stacked on a side of the drive circuit layer away from the base substrate 100. Due to the existence of the partition groove 221, each of the organic light emitting layer 500 and the common electrode layer 600 is divided into a plurality of discontinuous parts in the hole border area D.

Optionally, the array substrate is further formed with the encapsulation layer 700, which covers the common electrode layer 600, on the side of the common electrode layer 600 away from the base substrate 100.

The array substrate of the present disclosure may also be formed with the planarization layer 300, the planarization layer 300 is formed on the side of the drive circuit layer away from the base substrate 100, and the pixel electrode layer 400 is formed on the side of the planarization layer 300 away from the base substrate 100.

The array substrate of the present disclosure may also be formed with the pixel definition layer 800, the pixel definition layer 800 is formed on the side of the pixel electrode layer 400 away from the base substrate 100, and the organic light emitting layer 500 and the common electrode layer 600 are formed on the side of the pixel definition layer 800 away from the base substrate 100. In this way, referring to FIG. 23, the pixel layer 020 may further include a pixel definition layer 800. The pixel definition layer 800 has a plurality of through pixel openings arranged in a one-to-one correspondence with the plurality of pixel electrodes in the display area A, and any one of the pixel openings exposes at least part of the corresponding pixel electrode.

The array substrate of the present disclosure may also be formed with the support pillar 802 formed on the side of the pixel definition layer 800 away from the base substrate 100.

The present disclosure also provides an array substrate. As shown in FIG. 12, the array substrate includes the opening 101 and the hole border area D surrounding the opening 101; as shown in FIG. 21, the array substrate further includes the base substrate 100, the drive circuit layer (FIG. 21 does not show the drive circuit layer, but only shows the source-drain metal layer 200 of the drive circuit layer), the support portion 801, the pixel electrode layer 400, the organic light emitting layer 500 and the common electrode layer 600, wherein, the base substrate 100 is formed with the opening 101; the drive circuit layer is provided on a side of the base substrate 100; the drive circuit layer includes the source-drain metal layer 200, the source-drain metal layer 200 is formed with the second isolation pillar 220 surrounding the opening 101 in the hole border area D, and the second isolation pillar 220 includes the third metal layer 203 and the second metal layer 202 located on the side of the third metal layer 203 away from the base substrate 100; as shown in FIG. 20, the second isolation pillar 220 is formed with the partition groove 221 on the side of the second metal layer 202 close to the base substrate 100, so that the orthographic projection of the third metal layer 203 on the second metal layer 202 is within the range of the second metal layer 202; the support portion 801 is provided on the side of the second metal layer 202 close to the base substrate 100 and fill part of the partition groove 221; the pixel electrode layer 400 is provided on the side of the drive circuit layer away from the base substrate 100; the organic light emitting layer 500 is provided on the side of the pixel electrode layer 400 away from the base substrate 100, and is divided into a plurality of unconnected parts in the hole border area D by the second spacer 220; the common electrode layer 600 is provided on the side of the organic light emitting layer 500 away from the base substrate 100, and is divided into a plurality of unconnected parts in the hole border area D by the second isolation pillar 220.

In the array substrate provided by the present disclosure, the second isolation pillar 220 is provided with the partition groove 221, so it can divide each of the organic light emitting layer 500 and the common electrode layer 600 in the hole border area D into a plurality of discontinuous parts, and then the water and oxygen intrusion channel in the hole border area D can be blocked, and the encapsulation effectiveness of the array substrate in the hole border area D can be ensured. Also, the support portion 801 is provided in the partition groove 221, and the support portion 801 may support the second metal layer 202 so as to prevent the second metal layer 202 from partially falling off, which further improves the encapsulation effectiveness of the hole border area D.

The array substrate provided by the present disclosure can be prepared by the preparation method described in the foregoing embodiment of the preparation method of the array substrate, and the structure, principle and effect of the array substrate are described in detail in the foregoing embodiment of the preparation method of the array substrate, or it is reasonably deduced according to the description of the embodiment of the preparation method of the array substrate, and therefore the present disclosure will not be repeated here.

As shown in FIG. 20, the second isolation pillar 220 further includes the fourth metal layer 204, which is provided on the surface of the third metal layer 203 close to the base substrate 100; and an orthographic projection of the third metal layer 203 on the fourth metal layer 204 is located within the range of the fourth metal layer 204.

As shown in FIG. 17, the support portion 801 is at least located at the corner of the junction of the third metal layer 203 and the second metal layer 202.

As shown in FIG. 19, the support portion 801 also covers the lateral surface of the third metal layer 203.

As shown in FIG. 18, the support portion 801 is also located at the corner of the junction of the third metal layer 203 and the fourth metal layer 204.

In some embodiments, the material of the support portion 801 is a photoresist.

The embodiments of the present disclosure also provide a display device that includes any of the array substrates described in the above-mentioned array substrate embodiments. The display device can be a display panel, a mobile phone screen, a notebook screen, a smart watch screen, or other types of display devices. Since the display device has any of the array substrates described in the above-mentioned array substrate embodiments, it has the same beneficial effects, which will not be repeated here in this disclosure.

It should be understood that the present disclosure does not limit its application to the detailed structure and arrangement of components proposed in this specification. The present disclosure can include other embodiments, and can be implemented and executed in various ways. The aforementioned deformations and modifications fall within the scope of the present disclosure. It should be understood that the present disclosure disclosed and defined in this specification extends to all alternative combinations of two or more individual features mentioned or apparent in the text and/or drawings. All these different combinations constitute multiple alternative aspects of the present disclosure. The embodiments of the present specification illustrate the best way known for implementing the present disclosure, and will enable those of ordinary skill in the art to utilize the present disclosure.

What is claimed is:

1. An array substrate, comprising:
an opening, a hole border area surrounding the opening, and a base substrate formed with the opening;
a drive circuit layer provided on a side of the base substrate, wherein the drive circuit layer comprises a source-drain metal layer formed with a second isolation pillar surrounding the opening in the hole border area, the second isolation pillar comprises a third metal layer and a second metal layer located on a side of the third metal layer away from the base substrate, and the second isolation pillar is formed with a partition groove located on a side of the second metal layer close to the base substrate, so that an orthographic projection of the third metal layer on the second metal layer is within a range of the second metal layer;
a support portion provided on the side of the second metal layer close to the base substrate and filling part of the partition groove;
a pixel electrode layer provided on a side of the drive circuit layer away from the base substrate;
an organic light emitting layer provided on a side of the pixel electrode layer away from the base substrate, and divided into a plurality of disconnected parts in the hole border area by the second isolation pillar; and
a common electrode layer provided on a side of the organic light emitting layer away from the base substrate, and divided into a plurality of disconnected parts in the hole border area by the second isolation pillar, wherein:
the second isolation pillar further comprises a fourth metal layer, the fourth metal layer is provided on a surface of the third metal layer close to the base substrate, an orthographic projection of the third metal layer on the fourth metal layer is located within a range of the fourth metal layer, and an orthographic projection of the second metal layer on the fourth metal layer is located inside the range of the fourth metal layer; and
the support portion supports the second metal layer, the support portion is located at least at a corner of a junction of the third metal layer and the second metal layer, and the support portion is a photoresist material that is not exposed to light and remains in the partition groove.

2. The array substrate of claim 1, wherein the support portion further covers a lateral surface of the third metal layer.

3. The array substrate according to claim 2, wherein the array substrate is implemented in a display device.

4. The array substrate according to claim 1, wherein the support portion is also located at a corner of a junction of the third metal layer and the fourth metal layer.

5. The array substrate according to claim 4, wherein the array substrate is implemented in a display device.

6. The array substrate according to claim 1, wherein the array substrate is implemented in a display device.

7. An array substrate, comprising:

an opening, a hole border area surrounding the opening, and a base substrate formed with the opening;

a drive circuit layer provided on a side of the base substrate, wherein the drive circuit layer comprises a source-drain metal layer formed with a second isolation pillar surrounding the opening in the hole border area, the second isolation pillar comprises a third metal layer and a second metal layer located on a side of the third metal layer away from the base substrate, and the second isolation pillar is formed with a partition groove located on a side of the second metal layer close to the base substrate, so that an orthographic projection of the third metal layer on the second metal layer is within a range of the second metal layer;

a support portion provided on the side of the second metal layer close to the base substrate and filling part of the partition groove;

a pixel electrode layer provided on a side of the drive circuit layer away from the base substrate;

an organic light emitting layer provided on a side of the pixel electrode layer away from the base substrate, and divided into a plurality of disconnected parts in the hole border area by the second isolation pillar; and a common electrode layer provided on a side of the organic light emitting layer away from the base substrate, and divided into a plurality of disconnected parts in the hole border area by the second isolation pillar, wherein:

the support portion supports the second metal layer, and the support portion is a photoresist material that is not exposed to light and remains in the partition groove.

8. The array substrate according to claim 7, wherein the support portion is located at least at a corner of a junction of the third metal layer and the second metal layer.

9. The array substrate of claim 8, wherein the support portion further covers a lateral surface of the third metal layer.

10. The array substrate according to claim 8, wherein the second isolation pillar further comprises a fourth metal layer provided on a surface of the third metal layer close to the base substrate, and the support portion is also located at a corner of a junction of the third metal layer and the fourth metal layer.

* * * * *